United States Patent [19]

Fuerst et al.

[11] Patent Number: 5,456,616
[45] Date of Patent: Oct. 10, 1995

[54] ELECTRICAL DEVICE EMPLOYING A FLAT FLEXIBLE CIRCUIT

[75] Inventors: Robert M. Fuerst, Maple Park; Paul Krebaum, Lisle; Fred L. Krehbiel, Chicago, all of Ill.

[73] Assignee: Molex Incorporated, Lisle, Ill.

[21] Appl. No.: 192,086

[22] Filed: Feb. 4, 1994

[51] Int. Cl.⁶ .................................................. H01R 13/66
[52] U.S. Cl. ........................................ 439/620; 439/608
[58] Field of Search ........................ 439/98, 620, 607, 439/608

[56] References Cited

U.S. PATENT DOCUMENTS

| | | | |
|---|---|---|---|
| 3,713,072 | 1/1973 | Henschen et al. | 339/17 F |
| 4,024,627 | 5/1977 | Stauffer | 29/588 |
| 4,503,611 | 3/1985 | Sampson et al. | 29/845 |
| 4,667,401 | 5/1987 | Clements et al. | 29/832 |
| 4,696,764 | 9/1987 | Yamazaki | 252/503 |
| 4,921,436 | 5/1990 | Sole et al. | 439/395 |
| 4,970,624 | 11/1990 | Arneson et al. | 361/398 |
| 5,141,455 | 8/1992 | Ponn | 439/620 |
| 5,242,318 | 9/1993 | Plass | 439/620 |
| 5,266,054 | 11/1993 | Duncan et al. | 439/620 |
| 5,286,221 | 2/1994 | Fencl et al. | 439/620 X |

Primary Examiner—David L. Pirlot
Attorney, Agent, or Firm—A. A. Tirva

[57] ABSTRACT

An electrical connector assembly includes a housing fabricated of a first metal material and having at least one integral pin projecting from a face thereof. A flat flexible circuit is mounted against the face of the housing and includes a ground plane on a side thereof facing the housing. The circuit has a hole for receiving the integral pin of the housing. The ground plane is of a second metal material different from that of the housing. An omni-directional conductive adhesive is deposited on the ground plane over the area of the hole to expand the conductive interface between the metal housing and the metal ground plane. Preferably, the conductive adhesive includes abrasive grain-like particles.

2 Claims, 3 Drawing Sheets

ELECTRICAL DEVICE EMPLOYING A FLAT FLEXIBLE CIRCUIT

FIELD OF THE INVENTION

This invention generally relates to the art of electrical connectors and, particularly, to an electrical connector or electronic device including a flat flexible circuit such as a flat flexible capacitor filter circuit or the like.

BACKGROUND OF THE INVENTION

A variety of electrical connectors are designed for utilization with a flat flexible circuit which may be mounted directly on the connector or connected in circuit with terminal pins on the connector. Generally, flat flexible circuits include a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Normally, each hole is smaller in diameter than a respective pin. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesives were developed to replace soldering techniques which require specific temperature resistant components and substrates. Although such adhesives serve their intended purposes, they are relatively expensive and, for that reason, undesirable in some applications.

Flat flexible circuitry often is used in environments wherein the circuitry must be protected from disruptions or "noise" caused be electromagnetic interference (EMI), radio frequency interference (RFI), electrostatic discharges (ESD) and/or electromagnetic pulses (EMP). Such applications may range from use in high frequency pulse circuits, such as computers and vehicles, wherein signals are generated which will cause radio frequency interference and electromagnetic interference to nearby radio and other electronic devices, to other applications wherein equipment must be protected against power surges owing to electrostatic discharges and electromagnetic pulses as well. A high voltage generated by electrostatic discharges and electromagnetic pulses can damage voltage sensitive integrated circuits and the like.

In environments as described above, including automotive applications, it is desirable to provide the connector assembly with a filtering capability, such as to suppress EMI and RFI, and transient suppression of EMP and ESD interference or other undesirable signals which may transit circuits terminated to the connectors. Employing filter components in a connector assembly creates problems in manufacture and assembly because of the undue complexity of the connectors, particularly in substantially increasing the assembly costs of the connectors. In the extremely high volume environment of automotive applications, cost considerations can be extremely important. In high density, high circuit count connectors, such as the main connector assembly of an automobile, still additional considerations must be addressed in mounting the connector assembly to a printed circuit board and still employ all of the necessary filter components. A solution to this myriad of problems is shown in co-pending application Ser. No. 07/962,763, filed Oct. 19, 1992, which is assigned to the assignee of the present invention and which is incorporated herein by reference.

In particular, in that co-pending application, flat flexible circuitry is employed and is mounted directly on to the connector housing, such as a rear face of the housing. The flat flexible circuitry is a flexible capacitor filter circuit which includes a plurality of chip capacitors operatively associated with tail portions of the terminals of the connector projecting from the rear face of the housing and passing through the flexible capacitor filter circuit.

In applications as described above, the connector housing may be fabricated of die cast metallic material, such as of magnesium, aluminum and the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure.

The present invention is directed to solving the sizable myriad of problems identified above by utilizing a particular interfacing system between a conductive pin and a flat flexible circuit wherein different interfacing metal components are encountered, with a desire to ensure a reliable electrical/conductive interface over the life of the connector.

SUMMARY OF THE INVENTION

An object, therefore, of the invention is to provide a new and improved electrical device employing a flat flexible circuit.

In the exemplary embodiment of the invention, a multi-terminal filtered electrical connector assembly is illustrated. The assembly includes a housing having a plurality of terminal-receiving passageways and a rear face with the passageways communicating therethrough. The housing is fabricated of metal material such as magnesium, aluminum, metallized plastic and the like. The housing includes at least one integral pin projecting rearwardly from the rear face thereof. A plurality of terminals are received in the passageways, with tail portions of the terminals projecting from the rear face of the housing.

A flat flexible capacitor filter circuit is mounted against the rear face of the housing and through which the terminals extend. The circuit includes a flexible dielectric substrate having a hole therein for receiving the integral pin of the housing. An electrically conductive film is deposited on the substrate including an area about the hole. The film is of a metal material such as copper or the like to define a ground plane of the connector. An omni-directional conductive adhesive may be deposited on the conductive film over the area of the hole or on the pin and the area of the housing around the pin. The adhesive includes a nonconductive base incorporating electrically conductive particles therein. The conductive adhesive expands the conductive interface between the metal housing and the metal ground plane defined by the conductive film. Typically, electrically conductive particles in an omni-directional conductive adhesive have substantially smooth spherical or flake shapes which reduce resin demand, thus enabling higher loading to maximize contact between adjacent particles, which in turn promotes higher conductivity in all directions.

Because in the present invention two dissimilar metals are to be joined, the conductive particles of the conductive adhesive are abrasive grain-like particles. The particles may be of nickel, cobalt, or iron particles, conductive metal alloy particles of the aforesaid metals or conductive metal compound particles such as tungsten carbide or the like. The abrasive particles are beneficial in breaking through oxides which may be formed on the surfaces of the two dissimilar metals to be joined.

As disclosed in the connector illustrated herein, at least a portion of the rear face of the housing is juxtaposed against the conductive film of the flexible filter circuit surrounding the hole therein. The conductive adhesive extends outwardly of the hole at least between the portion of the rear face of the housing and the conductive film of the filter circuit. A plurality of chip capacitors are mounted on the filter circuit operatively associated with the tail portions of the terminals passing through the filter circuit.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
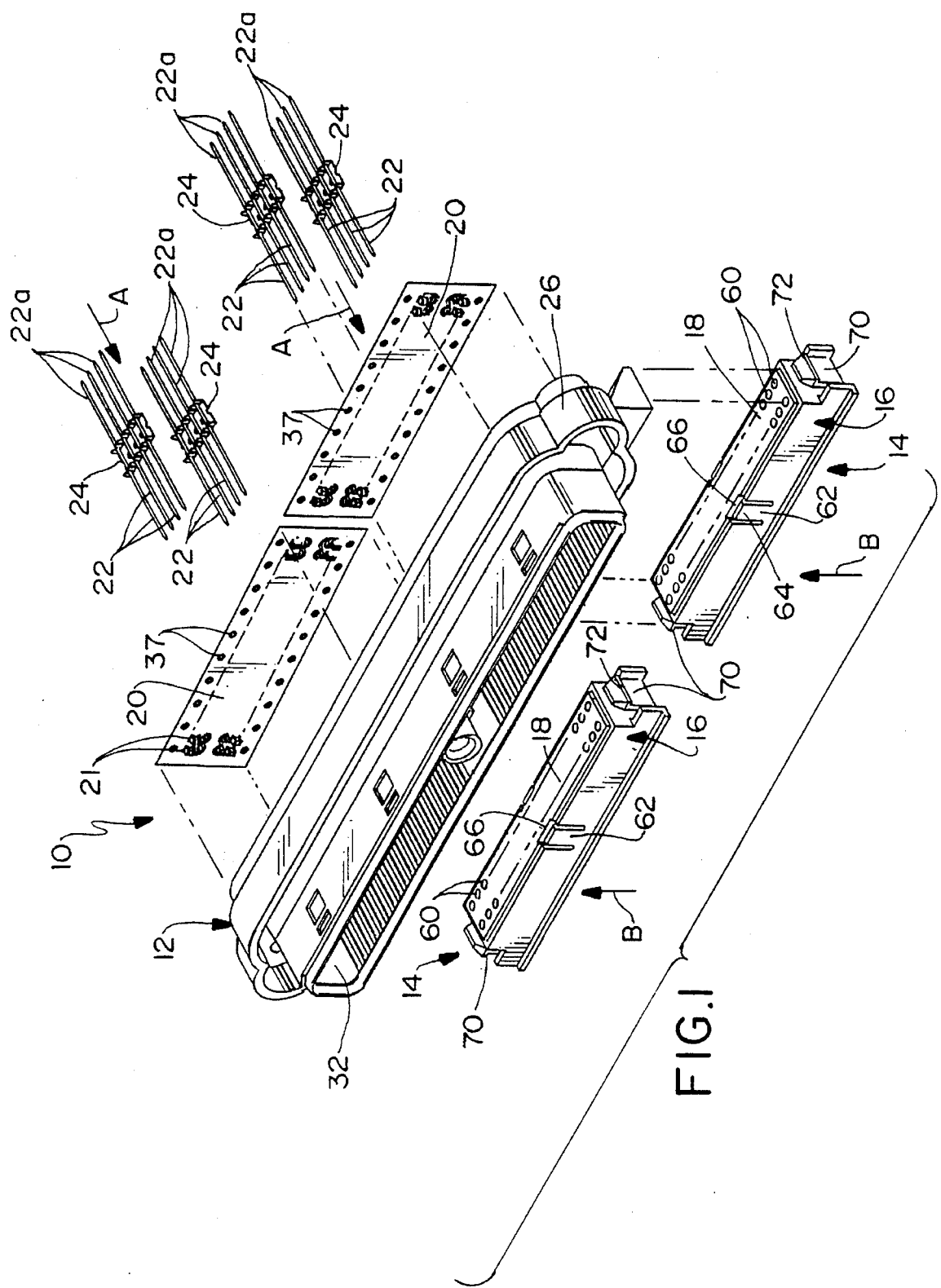
FIG. 1 is an exploded perspective view of a multi-terminal filtered electrical connector assembly incorporating the invention.

Referring to the drawings in greater detail, and first to FIG. 1, the invention is incorporated in a multi-terminal filtered electrical connector assembly, generally designated 10. The connector assembly includes a main connector, generally designated 12, and a pair of subassemblies, generally designated 14. Each subassembly 14 includes a terminal alignment plate, generally designated 16, which receives and mounts a ferrite filter block 18. The subassemblies are mounted to main connector 12, as will be described in greater detail hereinafter. A pair of flexible capacitor filter circuits, generally designated 20, are mounted to the rear of connector 12, again as described in greater detail hereinafter. A plurality of terminals 22 are mounted in main connector 12 and are assembled, through flexible capacitor filter circuits 20, to the main connector in the direction of arrows "A". An alternative method is to mount the pins first and then to press the flexible circuits over the pins. Each flexible capacitor filter circuit has a plurality of chip capacitors 21 operatively associated with the terminals passing therethrough. Each terminal 22 includes a tail portion 22a. For illustration purposes, FIG. 1 shows groups of terminals 22 retained on bandolier holders 24 which simply are used temporarily for inserting the terminals into main connector 12 in the direction of arrows "A". Although only sixteen terminals are shown in groups of four, connector 12 can mount as many as 160 or more terminals.

Figure 2:
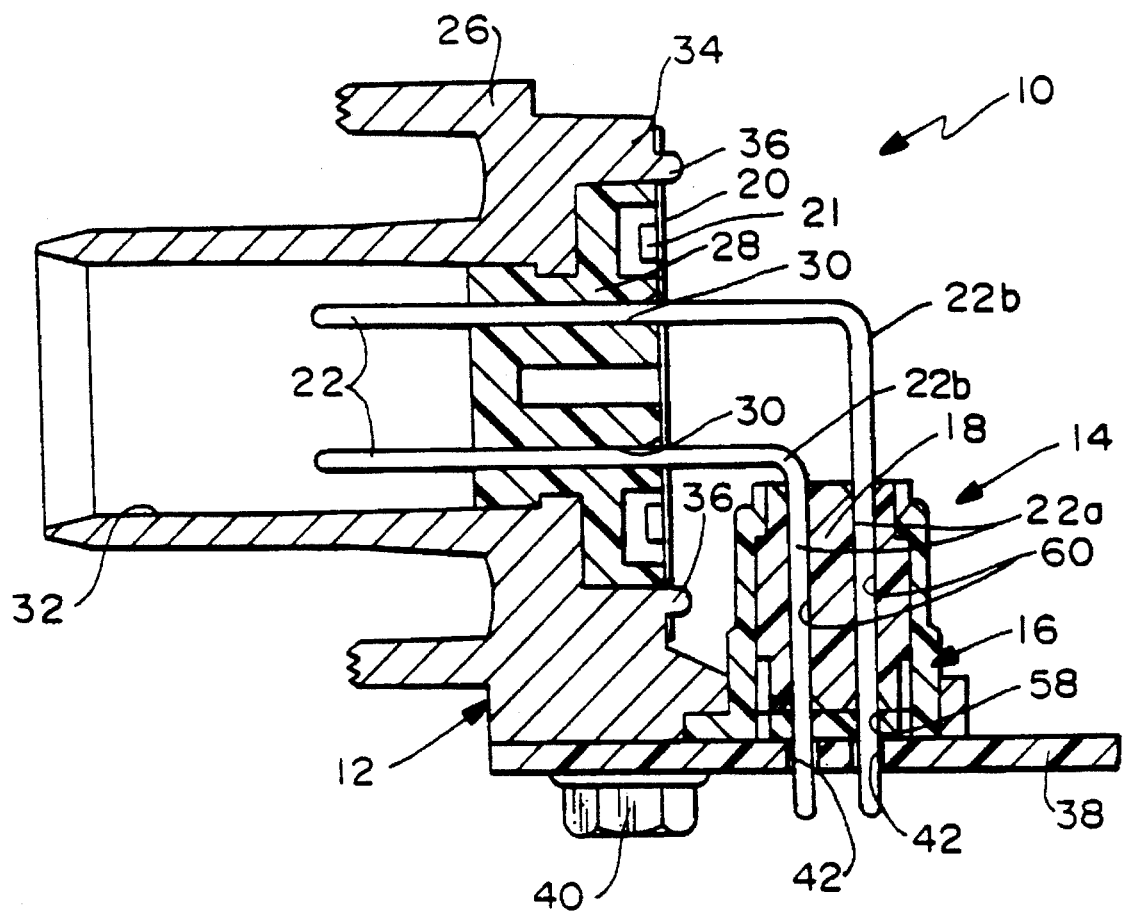
FIG. 2 is a vertical section, on an enlarged scale, through the connector assembly and with the assembly mounted to a printed circuit board.

Referring to FIG. 2 in conjunction with FIG. 1, main connector 12 includes a die cast housing 26 having an injection molded dielectric insert 28. The housing, through insert 28, includes a plurality of through passageways 30 for receiving terminals 22 whereby forward mating ends of the terminals are exposed in a cavity 32 of the housing. The cavity is provided for receiving a complementary electrical connector assembly (not shown) which will have female terminals for interengagement with terminals 22. Die cast housing 26 defines a rear face 34 thereof, with a plurality of mounting pins 36 projecting from the rear face for insertion into mounting holes 37 in flexible capacitor filter circuits 20 to mount the circuits to the rear of the housing and establish electrical contact between the housing and the flexible circuits.

Still referring to FIG. 2 in conjunction with FIG. 1, it can be seen that main connector 12, particularly die cast housing 26, is constructed to provide a right angle connector mountable to a printed circuit board 38, with terminals 22 extending through passageways 30 generally parallel to the printed circuit board. Appropriate fastening means 40 is provided for securing main connector 12, through its housing, to the printed circuit board in its right angle orientation. It can be seen that terminals 22 are bent at right angles, as at 22b, so that tail portions 22a of the terminals extend perpendicular to printed circuit board 38 for insertion into appropriate holes 42 in the circuit board for interconnection to appropriate circuit traces on the board or in the holes.

Figure 3:
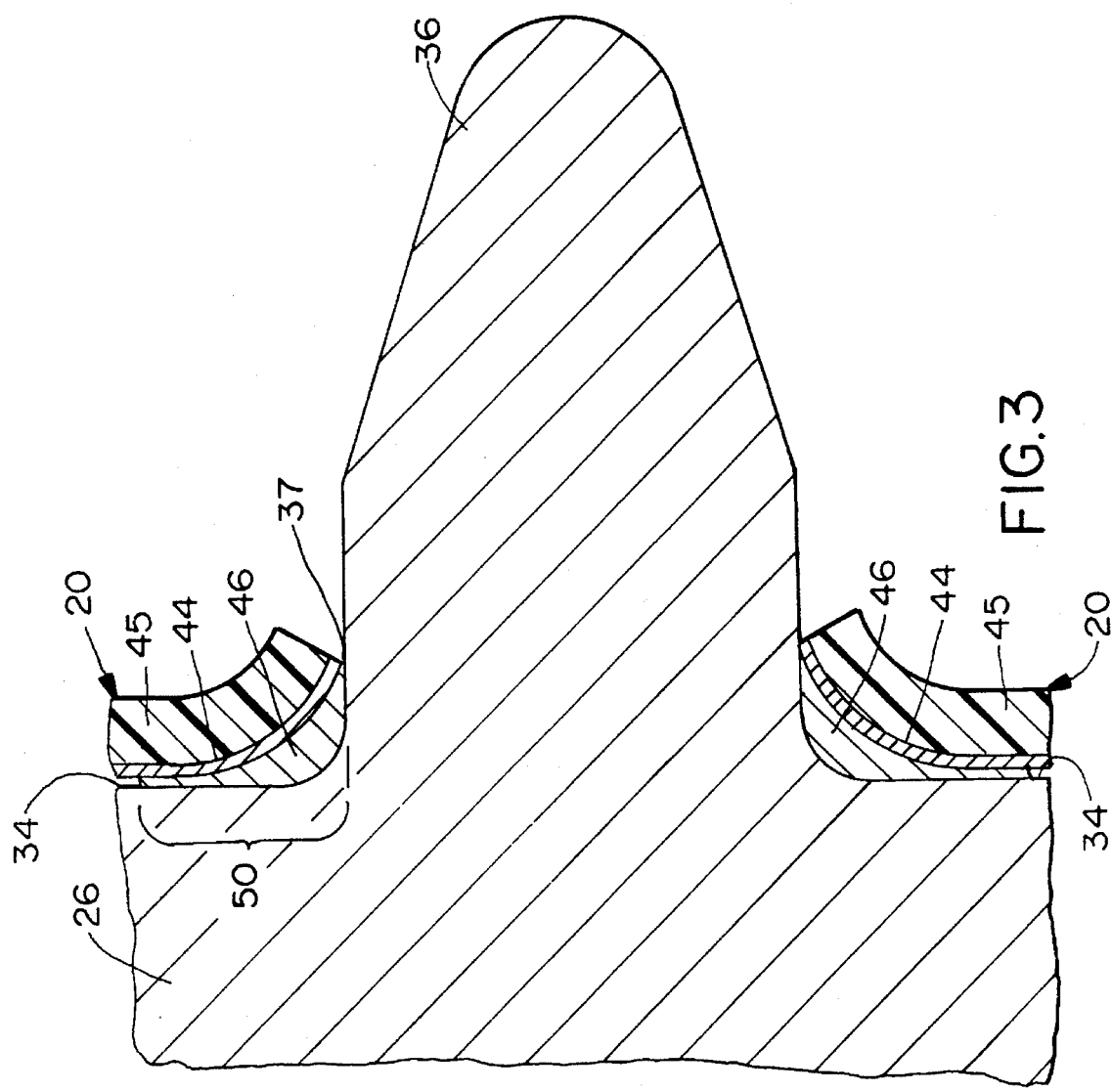
FIG. 3 is a greatly enlarged section through the housing pin projecting through the flat flexible circuit.

Referring to FIG. 3 in conjunction with FIGS. 1 and 2, one of the mounting pins 36 of die cast housing 26 is shown projecting through a hole 37 in flat flexible circuit 20. More particularly, the flat flexible circuit includes a flat dielectric substrate 45 which may be of various materials, but a polyamide material marketed by Du Pont Corporation under the trademark KAPTON has proven effective. Other materials, such as a polyester material marketed under the trademark MYLAR also could be used. Hole 37 may be provided as a prepunched, generally round hole for receiving a round pin such as pin 36.

A ductile conductive film or flat conductor 44 is deposited on substrate 45 in an area at least about hole 37. However, in the embodiment illustrated herein, the film 44 substantially covers dielectric substrate 45 (i.e. flat flexible circuit 20) and acts as a ground plane for the connector assembly. The film is of copper or like material and may be plated with a tin/lead alloy like material or precious metal.

A conductive adhesive 46 is deposited on conductive film 44 over the area of the hole in substrate 45 of flat flexible circuit 20 or on the pin 36 and the area of the housing around the pin. The adhesive is an omni-directional adhesive (versus a "Z-axis" adhesive) and includes a nonconductive base or resin incorporating conductive particles therein. Since the adhesive is omni-directional, it is not limited in its areas of conductivity to points of pressure as in "Z-axis" adhesives. Therefore, the omni-directional adhesive expands the conductive interface between the metal pin/housing and the metal ground plane. The adhesive includes in excess of twenty-five percent by weight content of conductive particles.

It should be understood that with pin 36 and housing 26 being fabricated of a first metal material such as magnesium, aluminum and the like, and with conductive film 44 being fabricated of copper material with or without a tin/lead plating, a conductive interface is created between dissimilar metals. Under such circumstances, such adhesives as "Z-axis" adhesives, in addition to being expensive, provide limited conductive areas restricted to points of sufficient pressure to "activate" the adhesive. The invention contemplates that adhesive 46 be an omni-directional adhesive. Preferably, the conductive particles of the adhesive are abrasive grain-like particles that break through oxides formed on the surfaces of dissimilar metals at the conductive interface. A preferred composition of the particles is a nickel material.

As seen in FIG. 3, adhesive 46 extends radially outwardly of hole 37 and pin 36 along a portion 50 of the rear face 34 of housing 26. In other words, portion 50 of rear face 34 is juxtaposed against or over the ground plane defined by conductive film 44 of flat flexible circuit 20. Therefore, the conductive interface between-the housing and the ground plane is considerably expanded beyond the interface defined solely by pin 36 within hole 37 of the flat flexible circuit. This is afforded by the omni-directional adhesive.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A multi-terminal filtered electrical connector assembly, comprising:

a housing having a plurality of terminal-receiving passageways and a rear face with said passageways communicating therethrough, the housing being fabricated of a first metal material and including at least one integral pin projecting rearwardly from said face;

a plurality of terminals received in the passageways with tail portions of the terminals projecting from the rear face of the housing;

a flat flexible capacitor filter circuit mounted against the rear face of the housing and through which the terminals extend, the circuit including a flat flexible dielectric substrate having a hole therein for receiving the integral pin of the housing, and a conductive film on the substrate including an area about said hole, the film being of a second metal material to define a ground plane of the filter circuit; and an omni-directional conductive adhesive deposited on the conductive film over the area of said hole, the adhesive including a nonconductive base incorporating only conductive abrasive grain-like particles therein, the conductive adhesive expanding the conductive interface between the metal housing and the metal ground plane defined by said conductive film.

2. The multi-terminal filtered electrical connector assembly of claim 1 wherein said filter circuit includes a plurality of chip capacitors operatively associated with said tail portions of the terminals passing through the filter circuit and wherein said first and second metal materials are magnesium and copper, respectively.

\* \* \* \* \*